(12) United States Patent
Sekino

(10) Patent No.: US 7,013,230 B2
(45) Date of Patent: Mar. 14, 2006

(54) INPUT-OUTPUT CIRCUIT AND A TESTING APPARATUS

(75) Inventor: Takashi Sekino, Tokyo (JP)

(73) Assignee: Advantest Corporation, Tokyo (JP)

(*) Notice: Subject to any disclaimer, the term of this patent is extended or adjusted under 35 U.S.C. 154(b) by 217 days.

(21) Appl. No.: 10/757,304

(22) Filed: Jan. 14, 2004

(65) Prior Publication Data

US 2004/0145375 A1 Jul. 29, 2004

Related U.S. Application Data

(63) Continuation of application No. PCT/JP02/07259, filed on Jul. 17, 2002.

(30) Foreign Application Priority Data

Jul. 17, 2001 (JP) .............................. 2001-216792

(51) Int. Cl.
*G06F 19/00* (2006.01)
(52) U.S. Cl. .................... 702/117; 702/120; 324/763
(58) Field of Classification Search ................ None
See application file for complete search history.

(56) References Cited

U.S. PATENT DOCUMENTS

| | | | | |
|---|---|---|---|---|
| 5,821,529 | A * | 10/1998 | Chihara et al. | 250/214.1 |
| 6,255,839 | B1 * | 7/2001 | Hashimoto | 324/765 |
| 6,294,949 | B1 * | 9/2001 | Kojima et al. | 327/538 |
| 6,313,657 | B1 * | 11/2001 | Hashimoto | 324/763 |
| 6,329,892 | B1 * | 12/2001 | Wohlfarth et al. | 335/151 |
| 6,377,065 | B1 * | 4/2002 | Le et al. | 324/765 |
| 6,404,220 | B1 * | 6/2002 | Hashimoto | 324/765 |
| 6,445,208 | B1 * | 9/2002 | Sugamori | 324/771 |
| 6,836,136 | B1 * | 12/2004 | Aghaeepour | 324/765 |
| 6,856,158 | B1 * | 2/2005 | Frame et al. | 324/765 |
| 6,885,213 | B1 * | 4/2005 | Sunter | 324/765 |
| 2001/0052097 | A1 * | 12/2001 | Miura | 714/744 |
| 2002/0036513 | A1 * | 3/2002 | Hashimoto | 324/765 |
| 2002/0070726 | A1 * | 6/2002 | Sugamori | 324/158.1 |
| 2002/0144202 | A1 * | 10/2002 | Hapke | 714/736 |
| 2003/0028832 | A1 * | 2/2003 | Schaber et al. | 714/700 |

FOREIGN PATENT DOCUMENTS

| | | |
|---|---|---|
| JP | 4-42781 | 10/1992 |
| JP | 11-64436 | 3/1999 |
| JP | 11-311661 | 11/1999 |
| JP | 3052834 | 4/2000 |

OTHER PUBLICATIONS

Patent Abstracts of Japan, Publication No. 11-311661 dated Nov. 9, 1999, 2 pgs.

(Continued)

*Primary Examiner*—Patrick J. Asouad
(74) *Attorney, Agent, or Firm*—Osha•Liang LLP

(57) ABSTRACT

An input-output circuit sending and/or receiving a signal to and/or from an electronic device includes a driver for supplying a signal to the electronic device, a comparator provided parallel to the driver for receiving a signal from the electronic device, a relaying circuit provided between the comparator the electronic device in series with the comparator and the electronic device, a first transmission line for coupling the comparator and the relaying circuit electrically and a first switch for selecting either of short or open-circuited state of the first transmission line and the electronic device, wherein the impedance of the relaying circuit is larger than the impedance of the first transmission line.

17 Claims, 3 Drawing Sheets

OTHER PUBLICATIONS

Patent Abstracts of Japan, Publication No. 09-264934 dated Oct. 7, 1997, 2 pgs.

Patent Abstracts of Japan, Publication No. 04-42781 dated Feb. 13, 1992, 2 pgs.

Patent Abstracts of Japan, Publication No. 11-064436 dated Mar. 5, 1999, 2 pgs.

International Search Report issued in Int'l. Application No. PCT/JP02/07529; mailed Oct. 8, 2002, 3 pgs.

International Preliminary Examination Report issued in Int'l. Application No. PCT/JP02/07259; mailed Oct. 7, 2003, 6 pgs.

International Preliminary Examination Report dated Mar. 3, 2004 (9 pgs.).

* cited by examiner

INPUT-OUTPUT CIRCUIT AND A TESTING APPARATUS

The present application is a continuation application of PCT/JP02/07259, filed Jul. 17, 2002 which claims priority from a Japanese patent application No. 2001-216792 filed on Jul. 17, 2001, the contents of which are incorporated herein by reference.

FIELD OF THE INVENTION

The present invention relates to a testing apparatus for testing an electronic device and an input-output circuit for sending and/or receiving signals to and/or from the electronic device. More particularly, the present invention relates to a testing apparatus capable of testing the direct current and alternating current characteristics with high accuracy, and an input-output circuit capable of sending and/or receiving direct current signals and alternating current signals to and/or from the electronic device with high accuracy. In addition, the present application claims the benefit of, and priority to, Japanese patent application No. 2001-216792 filed on Jul. 17, 2001, the entire contents of which are incorporated herein by reference for all purposes.

RELATED ART

A conventional testing apparatus for performing an alternating current test on an electronic device generally has a driver comparator and a transmission line coupled between the device under test and the driver comparator. When performing the test on the electronic device, test patterns are supplied to the electronic device from the driver via the transmission line, then the output signals outputted by the electronic device based on the test pattern are received by the comparator via the transmission line, and then the quality of the electronic device is judged based on the output signals. In addition, when performing the direct current test, the electronic device and the direct current supply are coupled via the transmission line, a desired direct voltage is applied to the electronic device, then the power supply current supplied to the electronic device via the transmission line is detected, and then the quality of the electronic device is judged based on the power supply current.

In the conventional testing apparatus, there is a parasitic capacitance component in the transmission line. Recently, in the electronic device such as a semiconductor device, the number of the input-output pins becomes increased. For this reason, it is necessary to have a plurality of driver comparators for the testing apparatus. Thus, the size of the circuit such as the driver comparator is increased, and it is difficult to arrange the driver comparator to be close to the device under test. Accordingly, although the driver comparator and the device under test are electrically coupled by using a long transmission line, it causes the parasitic capacitance component of the transmission line to be increased.

The output signals of the electronic device are given to the comparator via the transmission line, but the distortion might occur in the output signals because of the capacitance component of the transmission line. For example, there is the distortion such as the delay of the rising of the waveform. If the delay of the rising of the waveform occurs, it is difficult to perform the test with high accuracy, and difficult to test the device by using the test pattern of high frequency. The time constant for the delay of the rising of the waveform is given by the product of the output internal resistance of the device under test and the parasitic capacitance of the transmission line. Thus, it is preferable to reduce the parasitic capacitance of the transmission line.

SUMMARY OF THE INVENTION

Accordingly, it is an object of the present invention to provide a testing apparatus and an input-output circuit, which is capable of overcoming the above drawbacks accompanying the conventional art. The above and other objects can be achieved by combinations described in the independent claims. The dependent claims define further advantageous and exemplary combinations of the present invention.

In order to solve the problems above, according to the first aspect of the present invention, an input-output circuit sending and/or receiving a signal to and/or from an electronic device, includes a driver for supplying a signal to the electronic device, a comparator parallel to the driver for receiving a signal from the electronic device, a relaying circuit provided in series between the comparator the electronic device, a first transmission line for coupling the comparator and the relaying circuit electrically and a first switch for selecting either of short or open-circuited state of the first transmission line and the electronic device, wherein the impedance of the relaying circuit is larger than the impedance of the first transmission line.

The input-output circuit may further include a terminal circuit parallel to the comparator, wherein the impedance of the terminal circuit may be substantially equal to the impedance of the first transmission line. The terminal circuit may be provided between the first transmission line and a ground potential. The impedance of the relaying circuit may be smaller than an output rated load of the electronic device.

The impedance of the relaying circuit maybe larger than the internal output impedance of the electronic device. The relaying circuit may include a resistor of which the impedance is larger than that of the first transmission line. The input-output circuit may further include a second switch parallel to the first switch for selecting either of short or open-circuited state of the first transmission line and the electronic device, wherein the internal impedance of the second switch when the second switch is short-circuited maybe larger than the internal impedance of the first switch when the first switch is short-circuited and is smaller than the impedance of the relaying circuit.

The parasitic capacitance of the second switch maybe smaller than the parasitic capacitance of the first switch. The input-output circuit may further include a switch controller for controlling the first switch to be short-circuited in case the driver supplies a signal to the electronic device and to be open-circuited in case the comparator receives a signal from the electronic device.

The input-output circuit may further include a switch controller, wherein the switch controller controls the first switch to be short-circuited and the second switch to be open-circuited in case the driver supplies a direct current signal to the electronic device, the first switch to be open-circuited and the second switch to be short-circuited in case the driver supplies an alternating current signal to the electronic device and the first switch and the second switch to be open-circuited in case the comparator receives a signal from the electronic device. The input-output circuit may further include a second transmission line for coupling the first and second switches and the relaying circuit with the electronic device electrically, wherein the impedance of the transmission line may be substantially equal to a sum of the impedance of the first transmission line and the internal impedance of the second switch. The internal impedance of the second switch is substantially zero (0).

According to the second aspect of the present invention, a testing apparatus for testing an electronic device, includes a pattern generating unit for generating a test pattern for testing the electronic device, a waveform adjusting unit for adjusting the test pattern, an input-output circuit for supplying the test pattern adjusted by the waveform adjusting unit to the electronic device and receiving an output signal outputted by the electronic device based on the test pattern and a judging unit for judging quality of the electronic device based on the output signal, wherein the input-output circuit includes a driver for supplying the test pattern to the electronic device, a comparator parallel to the driver for receiving an output signal from the electronic device, are laying circuit provided in series between the comparator and the electronic device, a first transmission line for coupling the comparator and the relaying circuit electrically and a first switch for selecting either of short or open-circuited state of the first transmission line and the electronic device, wherein the impedance of the relaying circuit is larger than the impedance of the first transmission line.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
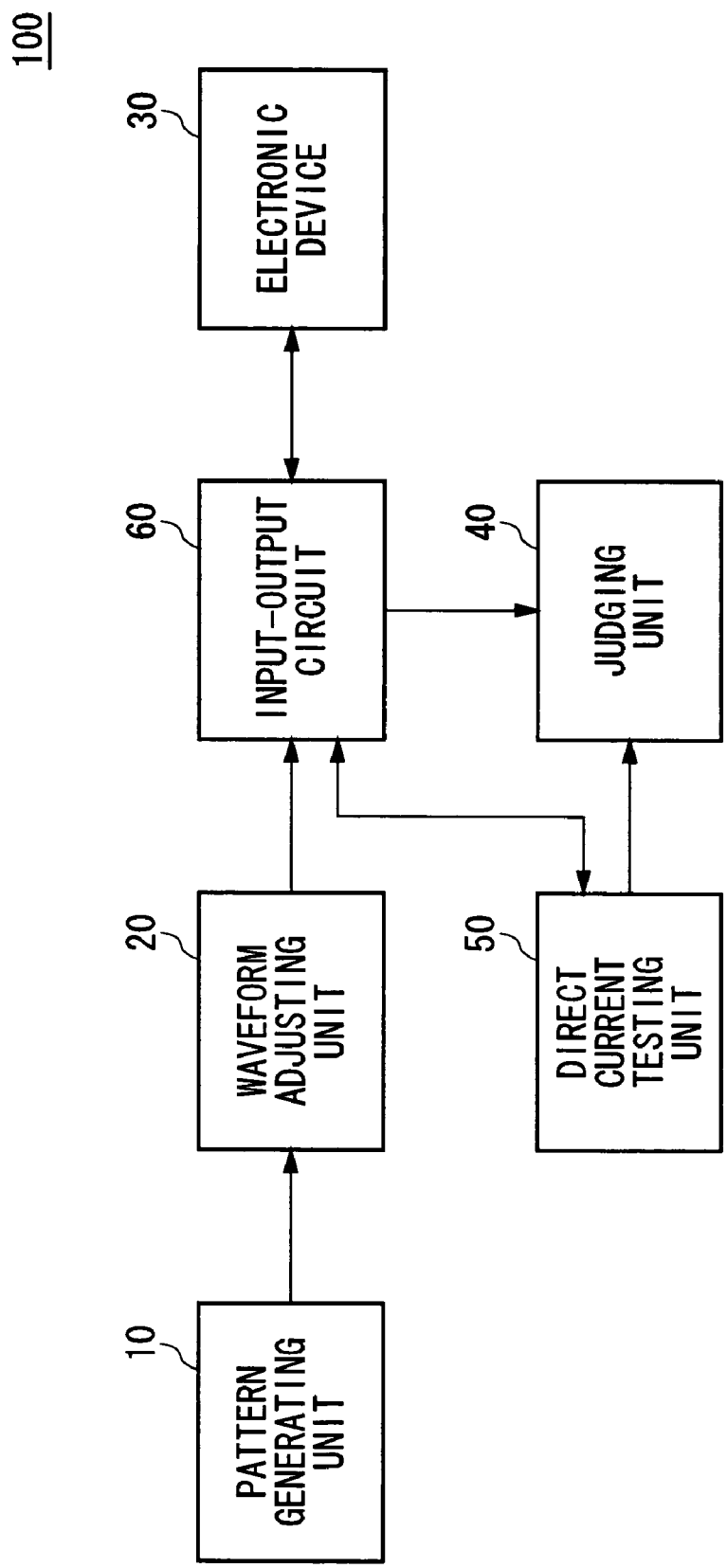
FIG. 1 shows an example of the configuration of a testing apparatus 100 in relation to the present invention.

FIG. 1 shows an example of the configuration of a testing apparatus 100 in relation to the present invention. The testing apparatus 100 has a pattern generating unit 10, a waveform adjusting unit 20, an input-output circuit 60, a direct current testing unit 50 and a judging unit 40. The pattern generating unit 10 generates test patterns for testing an electronic device and supplies them to the waveform adjusting unit 20. The waveform adjusting unit 20 adjusts the received test patterns and supplies the adjusted test patterns to the input-output circuit 60. The waveform adjusting unit 20 may supply the test patterns to the input-output circuit at a desired timing. The waveform adjusting unit 20 may have a timing generator for generating a desired timing.

The input-output circuit 60 sends and/or receives signals to and/or from the electronic device 30. For example, when performing the alternating current test, the input-output circuit 60 supplies the test patterns adjusted by the waveform adjusting unit 20, and receives the output signals outputted by the electronic device 30 based on the test patterns. The input-output circuit 60 may have a driver for supplying the test patterns to the electronic device 30 and a comparator for receiving the output signals from the electronic device 30. The input-output circuit 60 supplies the output signals to the judging unit 40.

The judging unit 40 judges the quality of the electronic device 30 based on the output signals. The judging unit 40, for example, may judge the quality of the electronic device 30 by comparing the expected value signals that the electronic device 30 should output based on the test patterns with the output signals outputted by the electronic device 30. In this case, the pattern generating unit 10 may generate the expected value signals based on the generated test patterns, and may supply them to the judging unit 40.

The direct current testing unit 50 performs the direct current test on the electronic device 30. The direct current testing unit 50, for example, may have voltage supply (not shown) for applying the desired direct voltage to the electronic device 30 and a current detecting unit (not shown) for detecting the power supply current supplied to the electronic device 30. The voltage supply applies the desired direct voltage to the electronic device 30 via the input-output circuit 60. The current detecting unit detects the power supply current supplied to the electronic device 30 via the input-output circuit 60. The current detecting unit supplies the information in relation to the detected power supply current to the judging unit 40. In this case, the judging unit 40 judges the quality of the electronic device 30 based on the received information in relation to the power supply current.

Figure 2:
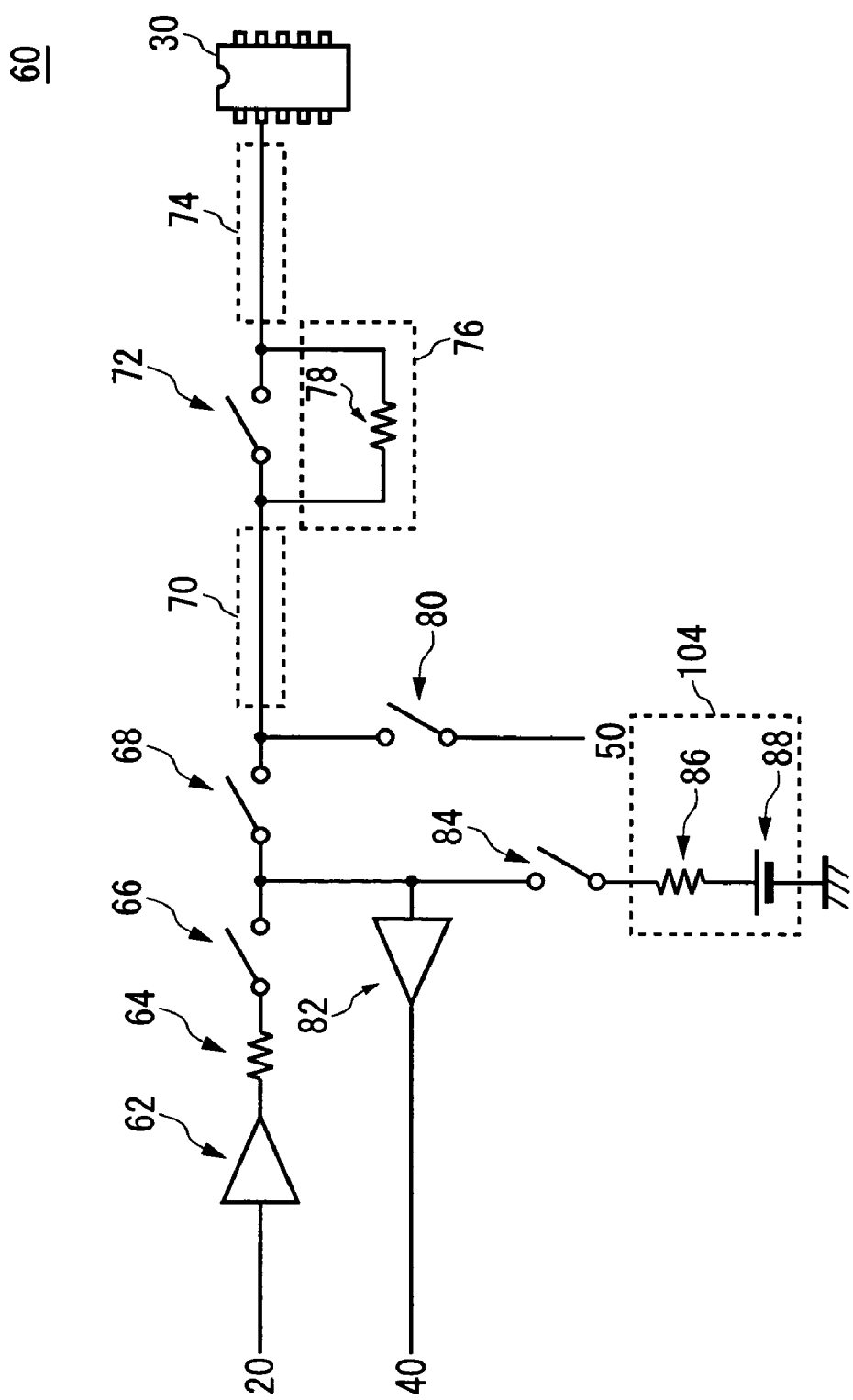
FIG. 2 shows an example of the configuration of an input-output circuit in relation to the present invention.

FIG. 2 shows an example of the configuration of the input-output circuit 60 in relation to the present invention. The input-output circuit 60 has a driver 62, a comparator 82, a resistor 64, switches (66, 68, 72, 84 and 80), a first transmission line 70, a relaying circuit 76, a terminal circuit 104 and a second transmission line 74.

The driver 62 supplies signals to the electronic device 30. In the present embodiment, the driver 62 receives the test pattern from the waveform adjusting unit 20, and supplies the received test pattern to the electronic device 30 via the first transmission line 70 and the second transmission line 74.

The comparator 82 is provided parallel to the driver 62, and receives signals from the electronic device 30. In the present embodiment, the comparator 82 receives the output signals from the electronic device 30, and supplies the received output signals to the judging unit 40. In addition, the comparator 82 may be given a predetermined reference voltage, so that it can compare the output signals with the reference voltage and supply the result of the comparison to the judging unit 40. In the present embodiment, the resistor 64 is an output load of the comparator 62.

The relaying circuit 76 is provided between the comparator 82 and the electronic device 30 in series with the comparator 82 and the electronic device 30. The impedance of the relaying circuit 76 is larger than the impedance of the first transmission line 70. As an example of the relaying circuit 76, the impedance of the resistor 78 may be larger than that of the first transmission line 70. In addition, it is preferable that the impedance of the relaying circuit 76 is smaller than that of the output rated load of the electronic device 30.

The first transmission line 70 is coupled between the comparator 82 and the relaying circuit 76 electrically. In addition, the second transmission line 74 is coupled between the relaying circuit 76 and the electronic device 30. The first transmission line 70 and the second transmission line 74 are, for example, coaxial cables.

The first switch 72 selects either of short or open-circuited state of the first transmission line 70 and the electronic device 30. In the present embodiment, the first switch 72 selects whether or not the first transmission line 70 and the electronic device 30 are short-circuited via the second transmission line 74.

The terminal circuit 104 is parallel to the comparator 84 between the first transmission line 70 and the setting voltage. It is preferable that the impedance of the terminal circuit 104 approximately equal to the impedance of the first transmission line 70. As an example of the terminal circuit 104, it has a terminal resistor 86 and a terminal voltage supply 88. The impedance of the first transmission line 70 may be substantially equal to the impedance of the terminal resistor 86, and may be substantially equal to the impedance of the combined resistance of the terminal resistor 86 and the internal resistance of the terminal voltage supply 88. By matching the impedances of the terminal circuit 104 and the first transmission line 70, it is possible to receive the output signals without being affected by the parasitic capacitance component of the transmission line 70, when the comparator 82 receives the output signals from the electronic device 30 via the transmission line 70. Next, the operations of each of the switches will be described when performing the alternating current test and the direct current test.

The case of performing the alternating current test will be first described. When supplying the test patterns to the electronic device 30 from the driver 62, the switch 66, the switch 68 and the first switch 72 are short-circuited, and the switch 84 and the switch 80 are open-circuited. In addition, when the comparator receives the output signals outputted from the electronic device 30, the switch 84 and the switch 68 are short-circuited, and the switch 66, the switch 80 and the first switch 72 are open-circuited. Since the switch 72 is open-circuited, the output signals are supplied to the comparator 82 via the second transmission line 74, the relaying circuit 76 and the first transmission line 70. In the present embodiment, the impedance of the first transmission line 70 and the impedance of the terminal circuit 104 are approximately the same, that is, the impedance-matching is accomplished, so that the capacitance component of the first transmission line 70 is not affected by the waveform of the output signals. Thus, it is possible to operate the power supply 60 at high speed.

In the present embodiment, since it is the capacitance component in regard to the second transmission line that the capacitance component of the transmission line is affected by the waveform of the output signals, it is possible to reduce the distortion of the waveform of the output signals in comparison to the prior art. In addition, since it is possible to configure the relaying circuit 76 and the first switch to have a minute circuit size, it is possible to arrange them near the electronic device 30. Thus, it is possible to lessen the parasitic capacitance of the second transmission line. In addition, by providing the first switch 72, it is possible to use the transmission line of low resistance when signals are supplied to the electronic device 30.

Next, the case of performing the direct current test will be described. When performing the direct current test, the switch 80 and the first switch 72 are short-circuited, and the switch 68 is open-circuited. The direct current testing unit 50 applies a desired voltage to the electronic device 30 via the first transmission line 70 and the second transmission line 74. At this time, the direct current testing unit 50 detects the power supply current supplied to the electronic device 30. According to the power supply 60 described above, it is possible to reduce the deterioration of the waveform of the output signals in regard to the alternating current test without the deterioration of the direct current test performance. In addition, the power supply 60 may have a switch controller for controlling the switches described above.

Figure 3:
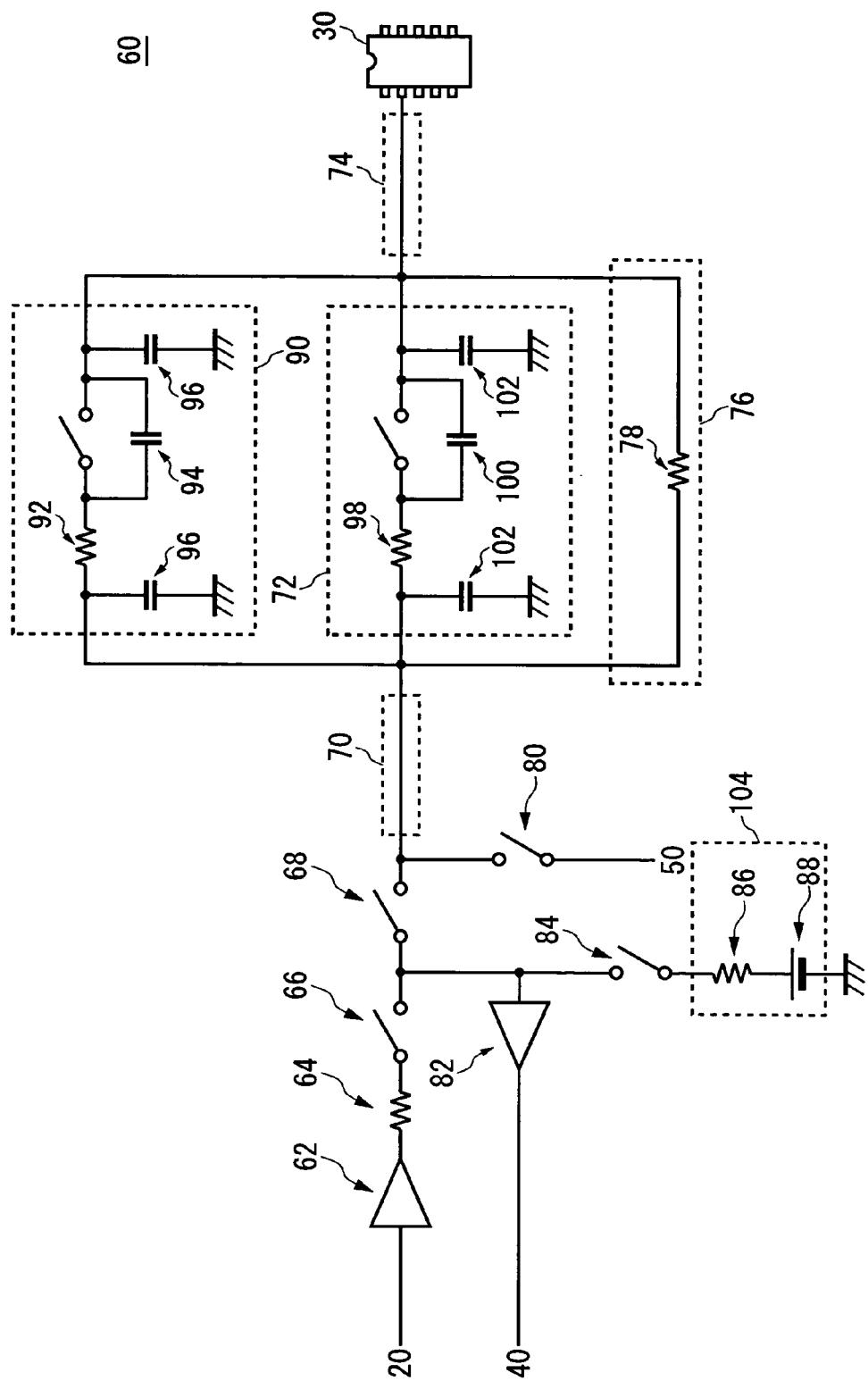
FIG. 3 shows another example of the configuration of an input-output circuit in relation to the present invention.

FIG. 3 shows another example of the configuration of an input-output circuit 60 in relation to the present invention. The input-output circuit 60 has a driver 62, a comparator 82, a resistor 64, switches (66, 68, 72, 84, 80 and 90), a first transmission line 70, a relaying circuit 76, a terminal circuit 104 and the second transmission line 74.

In FIG. 3, the driver 62, the comparator 82, the resistor 64, the switches (66, 68, 84 and 80), the first transmission line 70, the relaying circuit 76, the terminal circuit 104 and the second transmission line 74 have the same functions and configurations as those of the driver 62, the comparator 82, the resistor 64, the switches (66, 68, 84 and 80), the first transmission line 70, the relaying circuit 76, the terminal circuit 104 and the second transmission line 74 described in relation to FIG. 2.

The first switch 72 has a parasitic capacitance 102, a capacitance 100 between open terminals and an internal resistance 98 as shown in FIG. 3. The first switch 72, like the input-output circuit 60 in FIG. 2, is provided between the first transmission line 70 and the second transmission line 74. The second switch 90 is provided parallel to the first switch 72, and selects either of short or open-circuited state of the first transmission line 70 and the electronic device 30. The second switch 90, like the parasitic capacitance 96 shown in FIG. 3, has a capacitance 94 between open terminals and an internal resistance 92.

The internal impedance of the second switch 90 with the second switch 90 short-circuited may be larger than the internal impedance of the first switch 72 with the first switch 72 short-circuited and maybe smaller than the impedance of the relaying circuit 76. In the present embodiment, the impedance of the internal resistance 92 is larger than the impedance of the internal resistance 98, and is smaller than the impedance of the relaying circuit 76. In addition, the parasitic capacitance 96 of the second switch may be smaller than the parasitic capacitance 102 of the first switch.

It is preferable that the second switch 90 is a switch capable of operating with higher speed than the first switch 72. As an example, the first switch 72 may be a switch alternates shutting-opening mechanically, and the second switch 90 may be an FET (Field Effect Transistor) switch such as CMOSFET. The impedance of the internal resistance 92 of the first switch 72 may be about a few ohms, and the impedance of the internal resistance 98 of the second switch 72 may be a few tens of ohms. In addition, it is preferable that the impedance of the internal resistance 92 of the first switch 72 and the internal resistance 98 of the second switch 72 is smaller than the impedance of the relaying circuit 76. Next, the operation of the first switch 72 and the second switch 90 when performing the alternating current test and the direct current test will be described.

The case of performing the alternating current test will be first described. When the driver 62 supplies the test patterns to the electronic device 30, the first switch 72 is open-circuited, and the second switch 90 is short-circuited. Other switches (66, 68, 80 and 84) operate similar to the switches (66, 68, 80 and 84) described in relation to FIG. 2. When the comparator 82 receives the output signals of the electronic device 30, the first switch 72 and the second switch 90 are open-circuited. According to the switching operation of the present embodiment, it is possible to supply the test patterns to the electronic device 30 via the second switch 90 of smaller impedance than the relaying circuit 76. In addition, since the signals are sent and/or received to and/or from the electronic device 30 by open-circuiting or short-circuiting the second switch 90 capable of operating at high speed, it is possible to operate the power supply 60 at high speed.

Next, the case of performing the direct current test will be described. When performing the direct current test, the first switch 72 is short-circuited and the second switch 90 is open-circuited. Other switches (66, 68, 80 and 84) operate similar to the switches (66, 68, 80 and 84) described in relation to FIG. 2. According to the switching operating, the direct current testing unit 50 can perform the test on the electronic device 30 via the first switch of which the internal resistance is smaller than that of the second switch, and can judges the quality of the electronic device 30 with high accuracy. In addition, the power supply 60 may further have a switch controller for controlling the switches described above.

In addition, it is preferable that the impedance of the second transmission line 74 is approximately equal to the sum of the impedance of the first transmission line 70 and the internal impedance of the second switch 90. That is, if the impedance of the first transmission line 70, the impedance of the second transmission line 74 and the internal impedance of the second switch 90 are represented by $Z_1$, $Z_2$ and $Z_3$ respectively, it is preferable as follows:

$$Z_2 = Z_1 + Z_3.$$

By setting the impedance of the second transmission line 74 to be this value, it is possible to absorb the signal reflection that occurs at the contact point of the electronic device 30 and the second transmission line 74.

Although the present invention has been described by way of exemplary embodiments, it should be understood that those skilled in the art might make many changes and substitutions without departing from the spirit and the scope of the present invention, which is defined only by the appended claims.

As obvious from the description above, according to the present invention, it is possible to provide an input-output circuit and a testing apparatus, which operate with high speed so that the distortion of the signal waveform is reduced. Thus, it is possible to perform the test of the electronic device efficiently and accurately.

What is claimed is:

1. An input-output circuit sending and/or receiving a signal to and/or from an electronic device, comprising:
    a driver for supplying a signal to said electronic device;
    a comparator parallel to said driver for receiving a signal from said electronic device;
    a relaying circuit provided in series between said comparator and said electronic device;
    a first transmission line for coupling said comparator and said relaying circuit electrically; and
    a first switch for selecting either of short or open-circuited state of first transmission line and said electronic device,
    wherein impedance of said relaying circuit is larger than impedance of said first transmission line.

2. An input-output circuit as claimed in claim 1 further comprising a terminal circuit parallel to said comparator, wherein impedance of said terminal circuit is substantially equal to said impedance of said first transmission line.

3. An input-output circuit as claimed in claim 2, wherein said terminal circuit is provided between said first transmission line and a ground potential.

4. An input-output circuit as claimed in claim 3, wherein said impedance of said relaying circuit is smaller than an output rated load of said electronic device.

5. An input-output circuit as claimed in claim 4, wherein said impedance of said relaying circuit is larger than internal output impedance of said electronic device.

6. An input-output circuit as claimed in claim 5, wherein said relaying circuit comprises a resistor of which impedance is larger than said impedance of said first transmission line.

7. An input-output circuit as claimed in claim 6 further comprising a second switch parallel to said first switch for selecting either of short or open-circuited state of said first transmission line and said electronic device,
    wherein internal impedance of said second switch, when said second switch is short-circuited, is larger than said internal impedance of said first switch, when said first switch is short-circuited, and smaller than said impedance of said relaying circuit.

8. An input-output circuit as claimed in claim 7, wherein parasitic capacitance of said second switch is smaller than parasitic capacitance of said first switch.

9. An input-output circuit as claimed in claim 3 further comprising a switch controller for controlling said first switch to be short-circuited in case said driver supplies a signal to said electronic device and to be open-circuited in case said comparator receives a signal from said electronic device.

10. An input-output circuit as claimed in claim 7 further comprising a switch controller,
    wherein said switch controller controls said first switch to be short-circuited and said second switch to be open-circuited in case said driver supplies a direct current signal to said electronic device,
    said first switch to be open-circuited and said second switch to be short-circuited in case said driver supplies an alternating current signal to said electronic device, and
    said first switch and said second switch to be open-circuited in case said comparator receives a signal from said electronic device.

11. An input-output circuit as claimed in claim 10 further comprising a second transmission line for coupling said first and second switches and said relaying circuit with said electronic device electrically,
    wherein impedance of said transmission line is substantially equal to a sum of impedance of said first transmission line and said internal impedance of said second switch.

12. An input-output circuit as claimed in claim 11, wherein said internal impedance of said second switch is substantially zero (0).

13. A testing apparatus for testing an electronic device, comprising:
    a pattern generating unit for generating a test pattern for testing said electronic device;
    a waveform adjusting unit for adjusting said test pattern;
    an input-output circuit for supplying said test pattern adjusted by said waveform adjusting unit to said electronic device and receiving an output signal outputted by said electronic device based on said test pattern; and
    a judging unit for judging quality of said electronic device based on said output signal,
    wherein said input-output circuit comprises:
        a driver for supplying said test pattern to said electronic device;

a comparator provided parallel to said driver for receiving an output signal from said electronic device;

a relaying circuit provided in series between said comparator and said electronic device;

a first transmission line for coupling said comparator and said relaying circuit electrically; and a first switch for selecting either of short or open-circuited state of said first transmission line and said electronic device, wherein impedance of said relaying circuit is larger than impedance of said first transmission line.

14. An input-output circuit as claimed in claim 4 further comprising a switch controller for controlling said first switch to be short-circuited in case said driver supplies a signal to said electronic device and to be open-circuited in case said comparator receives a signal from said electronic device.

15. An input-output circuit as claimed in claim 5 further comprising a switch controller for controlling said first switch to be short-circuited in case said driver supplies a signal to said electronic device and to be open-circuited in case said comparator receives a signal from said electronic device.

16. An input-output circuit as claimed in claim 6 further comprising a switch controller for controlling said first switch to be short-circuited in case said driver supplies a signal to said electronic device and to be open-circuited in case said comparator receives a signal from said electronic device.

17. An input-output circuit as claimed in claim 8 further comprising a switch controller, wherein said switch controller controls said first switch to be short-circuited and said second switch to be open-circuited in case, said driver supplies a direct current signal to said electronic device, said first switch to be open-circuited and said second switch to be short-circuited in case said driver supplies an alternating current signal to said electronic device, and said first switch and said second switch to be open-circuited in case said comparator receives a signal from said electronic device.

* * * * *